(12) United States Patent
Wei

(10) Patent No.: US 8,644,014 B2
(45) Date of Patent: Feb. 4, 2014

(54) SERVER SYSTEM WITH HEAT DISSIPATION DEVICE

(75) Inventor: Chao-Ke Wei, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 597 days.

(21) Appl. No.: 12/972,495

(22) Filed: Dec. 19, 2010

(65) Prior Publication Data

US 2012/0087077 A1  Apr. 12, 2012

(30) Foreign Application Priority Data

Oct. 12, 2010   (TW) .................................. 99134815

(51) Int. Cl.
*H05K 5/00* (2006.01)

(52) U.S. Cl.
USPC ................. 361/679.31; 165/287; 454/239

(58) Field of Classification Search
USPC ................. 361/679.31; 165/287; 454/239
See application file for complete search history.

(56) References Cited

U.S. PATENT DOCUMENTS

| | | | |
|---|---|---|---|
| 7,372,698 B1* | 5/2008 | Tilton et al. | 361/701 |
| 2007/0025074 A1* | 2/2007 | Sone | 361/685 |
| 2008/0209931 A1* | 9/2008 | Stevens | 62/259.2 |
| 2008/0245083 A1* | 10/2008 | Tutunoglu et al. | 62/115 |
| 2008/0257639 A1* | 10/2008 | Yamaguchi et al. | 181/198 |
| 2009/0056910 A1* | 3/2009 | Mallia et al. | 165/80.3 |
| 2009/0211272 A1* | 8/2009 | Larsen | 62/89 |
| 2010/0085707 A1* | 4/2010 | Moss | 361/695 |
| 2011/0100618 A1* | 5/2011 | Carlson | 165/287 |
| 2011/0240281 A1* | 10/2011 | Avery | 165/287 |

* cited by examiner

Primary Examiner — Forrest M Phillips
(74) Attorney, Agent, or Firm — Altis Law Group, Inc.

(57) ABSTRACT

An exemplary server system includes a server cabinet, a number of racks received in the server cabinet, a number of servers mounted in the racks, and a heat dissipation device. The server cabinet includes a top plate, a bottom plate, and two end plates between the top and bottom plates. Each end plate defines an opening at a top end thereof and a plurality of apertures at a bottom end thereof. The servers are stacked between the end plates of the server cabinet with a channel defined therebetween. The heat dissipation device includes an intake fan arranged under the racks with air intakes thereof facing the apertures and air outlets thereof facing the channel, and two drawing fans respectively arranged at the openings of the two end plates for exhausting heated air of the server cabinet to the exterior.

19 Claims, 2 Drawing Sheets

SERVER SYSTEM WITH HEAT DISSIPATION DEVICE

CROSS REFERENCE TO RELATED APPLICATIONS

This application is related to two co-pending applications respectively entitled "SERVER SYSTEM WITH HEAT DISSIPATION APPARATUS" Ser. No. 12/972,509 and "SERVER SYSTEM WITH HEAT DISSIPATING DEVICE" Ser. No. 12/972,491, assigned to the same assignee of this application and filed on the same date as this application. The two related applications are incorporated herein by reference.

BACKGROUND

1. Technical Field

The present disclosure relates to heat dissipation from electronic apparatuses, and more particularly to a server system utilizing a heat dissipation device.

2. Description of Related Art

A server system often includes a number of standard servers stacked in a standard server cabinet. Each of the servers typically includes at least a power supply device, a motherboard, a hard disk drive, and an optical disk drive, all of which can generate considerable heat during operation. The servers may suffer damage if the heat is not efficiently removed.

What is needed, therefore, is a solution which can overcome the limitations described.

DETAILED DESCRIPTION

Figure 1:
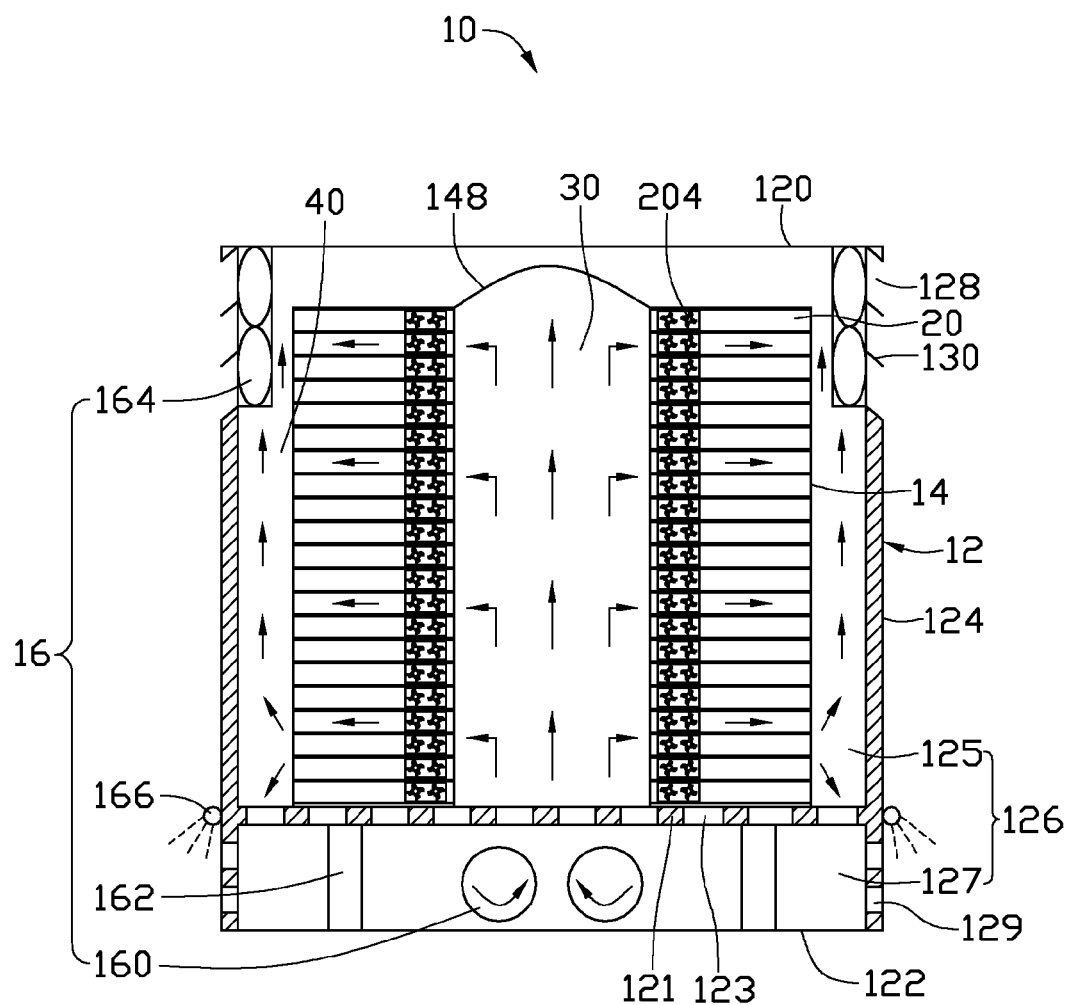
FIG. 1 is a schematic side view of a server system in accordance with an embodiment of the disclosure.

Referring to FIG. 1, a server system 10 in accordance with an exemplary embodiment is shown. The server system 10 includes a server cabinet 12, a number of racks 14 accommodated in the server cabinet 12, a number of servers 20 mounted in the racks 14, and a heat dissipation device 16 for cooling the servers 20.

The server cabinet 12 includes a top plate 120, a bottom plate 122 under the top plate 120, and two end plates 124 respectively interconnecting front and rear edges of the top and bottom plates 120 and 122. The top plate 120, the bottom plate 122, and the end plates 124 cooperatively define a space 126 in the server cabinet 12. A support plate 121 is arranged in the space 126 of the server cabinet 12. In this embodiment, the support plate 121 is substantially parallel to the top and bottom plates 120 and 122, but is much closer to the bottom plate 122. Front and rear edges of the support plate 121 are respectively joined to the two end plates 124.

The support plate 121 separates the space 126 of the server cabinet 12 into an upper portion 125 over the support plate 121 and a lower portion 127 under the support plate 121. The upper portion 125 is taller than the lower portion 127. A number of ventilation holes 123 are defined in the support plate 121, intercommunicating the upper portion 125 and the lower portion 127.

A number of apertures 129 are defined in a bottom end of each of the end plates 124, between the bottom plate 122 and the support plate 121. The apertures 129 communicate the lower portion 127 of the space 126 with the exterior. An opening 128 is defined in a top end of each of the end plates 124, adjacent to the top plate 120. The opening 128 is generally rectangular. A number of louvers 130 is arranged at each of the openings 128. The louvers 130 are parallel, and are evenly spaced from each other. Each of the louvers 130 extends outwards and downwards from the corresponding end plate 124.

The racks 14 are arranged in the upper portion 125 of the space 126 of the server cabinet 12, with each of pairs of racks 14 located between the two end plates 124. Each rack 14 is shorter than the upper portion 125 of the space 126. Thus, a top of each rack 14 is spaced a predetermined distance from the top plate 120 of the server cabinet 12. In this embodiment, the server cabinet 12 receives only one pair of racks 14 therein. A channel 30 is defined between the racks 14, and a passage 40 is defined between each of the end plates 124 and one corresponding neighboring rack 14. A sealing plate 148 is connected between the tops of the racks 14, thereby sealing a top of the channel 30. In this embodiment, the sealing plate 148 is convex.

Figure 2:
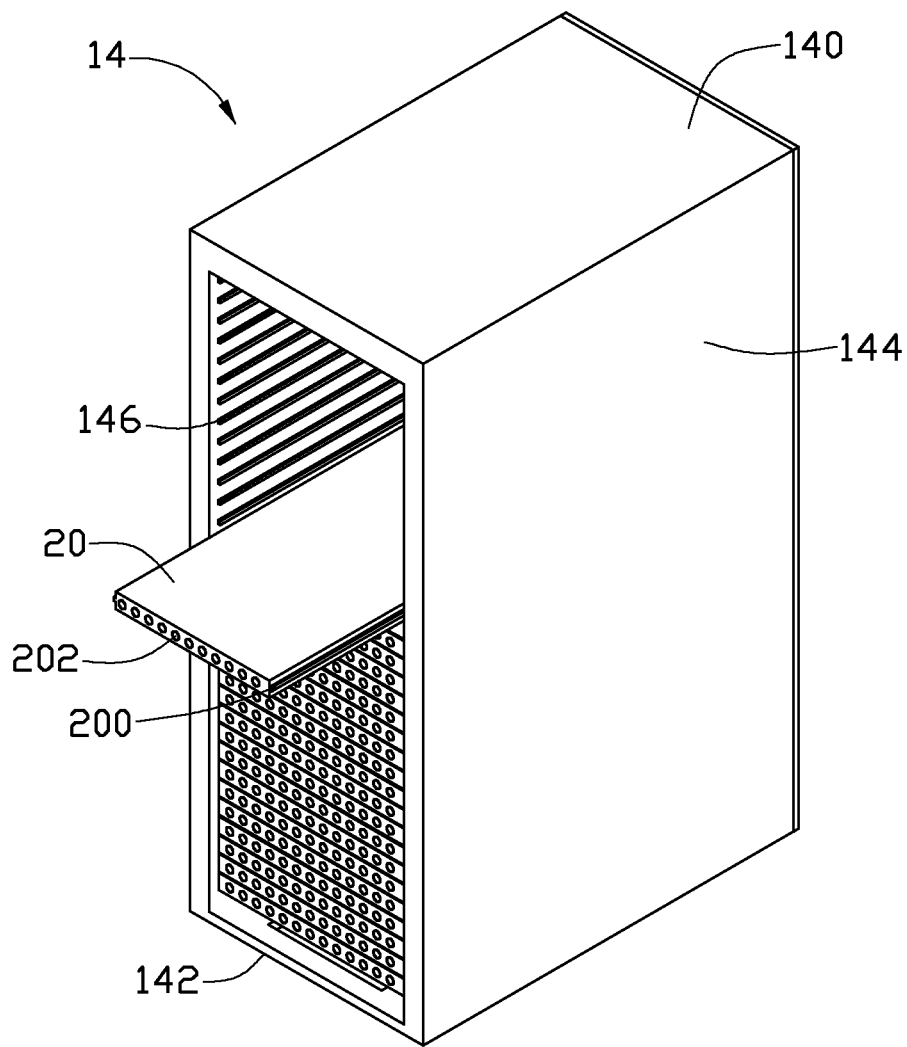
FIG. 2 is a schematic isometric view of a rack of the server system of FIG. 1 with a number of servers mounted therein.

Referring to FIG. 2, each rack 14 includes a rectangular top board 140, a bottom board 142 parallel to and spaced from the top board 140, and two sidewalls 144 respectively interconnected between left and right sides of the top and bottom board 140 and 142. That is, front and rear sides of the rack 14 are open. After assembly into the server cabinet 12, the sidewalls 144 are arranged perpendicular to the end plates 124, and the front and rear open sides of the rack 14 face the channel 30 and the corresponding passage 40, respectively.

A number of sliding rails 146 is formed on the sidewalls 144 of each rack 14, for facilitating installation of the servers 20. The sliding rails 146 are evenly distributed in pairs along a vertical axis of the rack 14. The servers 20 are stacked in each rack 14 along the vertical axis. Each server 20 has two guiding bars 200 respectively formed at left and right sides thereof, matching the sliding rail 146 of the rack 14. When assembled, the guiding bars 200 of the servers 20 slide along the respective sliding rails 146, allowing the servers 20 to slide into the rack 14.

Each server 20 defines a number of through holes 202 therein. In this embodiment, the through holes 202 extend through the server 20 along a front-to-rear direction for ventilation. Further, each server 20 has a number of cooling fans 204 arranged adjacent to the through holes 202. After assembly, the cooling fans 204 are oriented in such a manner that air inlets thereof face the channel 30 while air outlets thereof face the through holes 202, thereby drawing air from the channel 30 to the through holes 202 to evacuate heat from the servers 20.

Referring to FIG. 1 again, the heat dissipation device 16 includes two intake fans 160, two heat exchangers 162, two exhaust fans 164, and two nozzles 166. The intake fans 160 and the heat exchangers 162 are received in the lower portion 127 of the space 126 of the server cabinet 12, the exhaust fans 164 are respectively disposed at the openings 128 of the end plates 124, and the nozzles 166 are respectively fixed on outer sides of the bottom ends of the end plates 124. The nozzles 166 are adapted for spraying cold water. In this embodiment, the nozzles 166 are substantially at the same level as the support plate 121, over the apertures 129.

In this embodiment, the intake fans 160 are arranged close to each other, and are aligned with the channel 30. The intake fans 160 can be centrifugal fans or crossflow fans, and are arranged in such a manner that air intakes of the two intake fans 160 face toward the two end plates 124, respectively, and air outlets of the two intake fans 160 face the channel 30. The two heat exchangers 162 are disposed at opposite sides of the intake fans 160, each aligned with one rack 14. Preferably, the heat exchangers 162 are cold water heat exchangers.

The exhaust fans 164 are axial fans. Each exhaust fan 164 is disposed in such a manner that an air inlet thereof faces the corresponding passage 40 while an air outlet thereof faces the corresponding louvers 130.

During operation of the servers 20, heat is generated. Cooling air of the exterior is drawn into the lower portion 127 of the space 126 through the apertures 129 of the end plates 124 by the intake fans 160, during which time the cooling air is purified and cooled by the cold water of the nozzles 166 and further cooled by the heat exchangers 162. The cooling air is then drawn to the channel 30 through the ventilation holes 123 of the support plate 121 by the intake fans 160, and synchronously, the cooling fans 204 of the servers 20 rotate to draw the cooling air from the channel 30 to cross the through holes 202 of the servers 20 to the passages 40. During the passage of the cooling air along the through holes 202, heat of the servers 20 is transferred to the cooling air such that the cooling air becomes heated air.

A majority of the heated air flowing out of the servers 20 is drawn to flow up along the passages 40 by the exhaust fans 164, and is finally exhausted out of the server cabinet 12 through the openings 128 of the end plates 124. A minority of the heated air flowing out of the servers 20 into the passages 40 is typically adjacent to the support plate 121. Such heated air flows down the passages 40 to the lower portion 127 of the space 126 through the ventilation holes 123 of the support plate 121, and then is drawn through or past the heat exchangers 162 to the intake fans 160. During passage of the heated air through or past the heat exchangers 162, the heated air is cooled by the heat exchangers 162 to become cooling air. Therefore, cooling air can be continuously provided to the servers 20 to evacuate heat generated thereby, and thus the servers 20 maintain a low working temperature.

It is to be understood, however, that even though numerous characteristics and advantages of certain embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A server system, comprising:
    a server cabinet comprising a top plate, a bottom plate, and two end plates between the top and bottom plates, each of the end plates defining an opening at a top end thereof and an aperture at a bottom end thereof;
    a plurality of racks received in the server cabinet between the end plates, a channel being defined between the racks;
    a plurality of servers mounted in the racks; and
    a heat dissipation device comprising:
        a plurality of intake fans arranged under the racks with air intakes thereof facing the apertures and air outlets thereof facing the channel; and
        two drawing fans respectively arranged at the openings of the two end plates for exhausting heated air of the server cabinet to the exterior.

2. The server system of claim 1, wherein the intake fan is one of centrifugal fan and crossflow fan.

3. The server system of claim 1, wherein the drawing fan is an axial fan.

4. The server system of claim 1, wherein each of the servers comprises a cooling fan for drawing cooling air across the servers from the channel to evacuate heat of the server.

5. The server system of claim 4, wherein a plurality of through holes extends through each of the servers, and the cooling fans are arranged in such a manner that air outlets thereof face the through holes while air inlets thereof face the channel.

6. The server system of claim 1, wherein each heat exchanger is a cold water heat exchanger.

7. The server system of claim 1, further comprising a sealing plate connected between tops of the racks and sealing a top of the channel.

8. The server system of claim 7, wherein the sealing plate is convex.

9. The server system of claim 1, further comprising a support plate between the end plates of the server cabinet and separating an interior of the server cabinet into an upper portion over the support plate and a lower portion under the support plate, a plurality of ventilation holes defined in the support plate to intercommunicate the upper portion and the lower portion, the racks received in the upper portion, the air intake fan received in the lower portion, and the apertures below the support plate.

10. The server system of claim 9, wherein the heat dissipation device further comprises two heat exchangers received in the lower portion and located at opposite sides of the intake fan.

11. The server system of claim 9, wherein the heat dissipation device further comprises two nozzles respectively fixed on outer sides of the end plates, the nozzles being higher than and adjacent to the apertures.

12. The server system of claim 1, further comprising a plurality of louvers arranged at the openings, the louvers extending outwards and downwards from the end plates.

13. A server system, comprising:
    a server cabinet comprising a top plate, a bottom plate, and two end plates between the top and bottom plates, each of the end plates defining an opening at a top end thereof and an aperture at a bottom end thereof;
    a support plate between the end plates to divide an interior of the server cabinet into an upper portion over the support plate and a lower portion under the support plate, the support plate being higher than the apertures, a plurality of ventilation holes being defined in the support plate to communicate the upper portion with the lower portion;
    a plurality of racks received in the upper portion between the end plates, the racks being adapted for supporting servers thereon, a channel defined between the racks, and a passage defined between each of the end plates and one corresponding neighboring rack;
    a heat dissipation device comprising an intake fan received in the lower portion and aligned with the channel and two drawing fans respectively arranged at the openings of the end plates, wherein during operation, air is drawn through the apertures to the lower portion and then up to the channel by the intake fan, the drawing fans drawing air from the passages to cause the air in the channel to flow across the racks to exchange heat with the servers.

14. The server system of claim 13, wherein the heat dissipation device further comprises two heat exchangers received in the lower portion and disposed at opposite sides of the intake fan.

15. The server system of claim 13, wherein the heat dissipation device further comprises two nozzles adapted for spraying water, the nozzles respectively fixed on outer sides of the end plates and higher than and adjacent to the apertures.

16. The server system of claim 13, further comprising a plurality of louvers arranged at the openings, the louvers extending outwards and downwards from the end plates.

17. The server system of claim 13, further comprising a convex sealing plate connected between tops of the racks and sealing a top of the channel.

18. A server system, comprising:
- a server cabinet defining a space therein, and comprising two opposite end plates;
- a plurality of racks received in the space of the server cabinet, a channel defined between the racks, and a passage defined between each of the end plates and one corresponding neighboring rack;
- a plurality of servers mounted in the racks; and
- a heat dissipation apparatus, comprising an intake fan below the racks and aligned with the channel and two drawing fans respectively arranged at the openings of the end plates;

wherein a plurality of air circulation paths is defined in the server system, each air circulation path comprising a respective one of the apertures, the channel, a path across a respective one of the servers, the corresponding passage, and the opening of the corresponding end plate.

19. The server system of claim 18, further comprising a support plate between the end plates and located higher than the apertures, wherein the racks are supported on the support plate and the intake fan is located below the support plate, a plurality of ventilation holes are defined in the support plate, and each air circulation path further comprises a branch circulation path, with the branch circulation path running between the respective one of the servers and the channel, and comprising the corresponding passage and at least one of the ventilation holes.

* * * * *